United States Patent [19]

Barbu

[11] Patent Number: 4,972,103
[45] Date of Patent: Nov. 20, 1990

[54] ACCELERATED SWITCHING INPUT CIRCUIT

[75] Inventor: Stephane Barbu, Caen, France

[73] Assignee: U.S. Philips Corporation, New York, N.Y.

[21] Appl. No.: 387,454

[22] Filed: Jul. 28, 1989

[30] Foreign Application Priority Data

Aug. 19, 1988 [FR] France ................. 88 11033

[51] Int. Cl.[5] .................. H03K 3/295; H03K 19/013; H03K 19/086; H03K 17/04
[52] U.S. Cl. .................................. 307/455; 307/290; 307/359
[58] Field of Search ............ 307/455, 475, 443, 296.1, 307/289, 290, 355, 356, 358, 359

[56] References Cited

U.S. PATENT DOCUMENTS

| 3,558,914 | 1/1971 | Schmidt | 307/455 |
| 3,646,361 | 2/1972 | Pfiffner | 307/289 X |
| 3,694,198 | 9/1987 | Umeki | 307/290 |
| 4,629,913 | 12/1986 | Lechner | 307/455 X |
| 4,835,455 | 5/1989 | Coddington et al. | 307/455 X |

FOREIGN PATENT DOCUMENTS 264909 4/1987 Japan .

OTHER PUBLICATIONS

Pelka, "Schmitt-Trigger Inverter With Hystersis", Electronics, vol. 35, No. 12, Jun. 1986.
Dickes et al., "A Graphical Analysis of the Schmitt Circuit", IEEE Journal of Solid State Circuits, vol. SC-17, No. 6, Dec. 1982.

Primary Examiner—Stanley D. Miller
Assistant Examiner—David R. Bertelson
Attorney, Agent, or Firm—Bernard Franzblau

[57] ABSTRACT

An accelerated switching input circuit includes an emitter coupled logic stage having two transistors. The first transistor receives at its base an input signal and the second transistor receives at its base a control signal generated from the signal at the collector of the first transistor. A third transistor ($T_6$) has its base connected to the collector of the first transistor ($T_3$). A first resistor ($R_{10}$), a second resistor ($R_{11}$) and a third resistor ($R_{12}$) are disposed in series between the emitter of the third transistor and a reference voltage ($U_{REF}$) source. The point B common to the resistors $R_{11}$ and $R_{12}$ is coupled to the base of the second transistor ($T_4$).

4 Claims, 1 Drawing Sheet

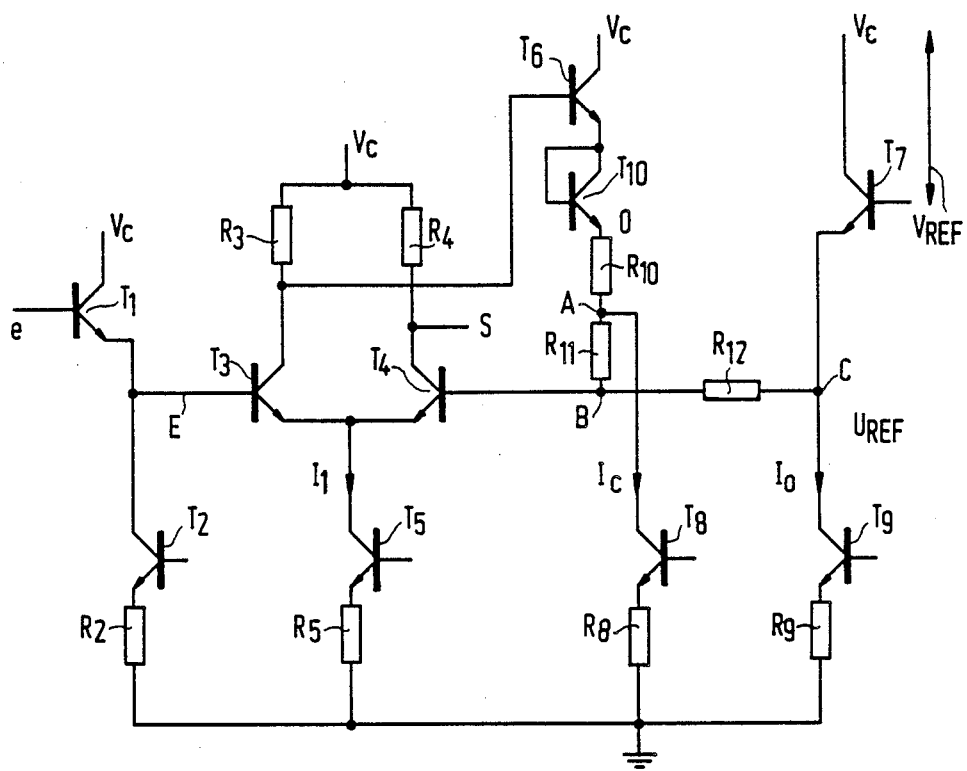

ACCELERATED SWITCHING INPUT CIRCUIT

BACKGROUND OF THE INVENTION

The invention relates to a switching input circuit having a stage of the emitter coupled logic (ECL) type having two transistors, the first receiving on its base an input signal and the second receiving on its base a control signal which is generated by a control circuit from the signal from the collector of the first transistor, in order to obtain on the collector of the second transistor an output signal switching faster than the input signal.

Such a circuit, generally used in order to compensate for the slowing down in switching due to highly capacitive input lines, is known from the MOTOROLA publication "Microelectronic Cell Data Book", the control signal consisting of a simple resistive divider bridge between the collector of the first transistor, the base of the second transistor and ground. When, for example, the voltage E changes from a low state to a high state, the putting into conduction of the first transistor causes the lowering of the voltage on the base of the second transistor, which accelerates the switching. This phenomenon is the same, in the opposite direction, for a transition of the signal E from a high state to a low state. The direct dependence between the control voltage and the signal from the collector of the first transistor means that it is not possible to select all of the operating parameters.

SUMMARY OF THE INVENTION

The present invention proposes an input circuit of the abovementioned type in which the value and the amplitude of the control voltage can be selected.

The circuit according to the invention is, for this purpose, characterized in that the control circuit comprises a third transistor whose collector is connected to a voltage supply source, whose base is connected to the collector of the first transistor and in that it successively comprises a first resistor, a second resistor and a third resistor disposed in series between the emitter of the third transistor and a reference point to which are connected a reference voltage source and a first reference current source, the point common to the first resistor and the second resistor being connected to a second reference current source, and the point common to the second resistor and the third resistor supplying the said control signal.

BRIEF DESCRIPTION OF THE DRAWINGS

The invention will be better understood on reading the following description with reference to the single figure which shows the preferred embodiment of the invention.

DESCRIPTION OF THE PREFERRED EMBODIMENTS

The circuit comprises an input follower stage comprising a transistor $T_1$ receiving on its base input signals e, and producing on an emitter signals E, this emitter being connected in a conventional way to a current source ($T_2$, $R_2$). This buffer stage is conventional and has only an optional decoupling function. The actual input circuit comprises a gate of the emitter coupled logic (ECL) type comprising two transistors $T_3$ and $T_4$ whose coupled emitters are connected to a current source ($R_5$, $T_5$) of value $I_1$. The collectors of transistors $T_3$ and $T_4$ are connected to a voltage supply source $V_c$ via the resistors $R_3$ and $R_4$ respectively. The base of the transistor $T_3$ receives the signal E from the first emitter of the transistor $T_1$. The output signal S is the signal supplied by the collector of the transistor $T_4$, the collector of the transistor $T_3$ supplying the complementary signal $\bar{S}$.

The base voltage of the transistor $T_4$ is determined by the collector voltage of the transistor $T_3$. With regard to the prior art, it has already been mentioned that this was performed by potentiometric division of the collector voltage of the transistor $T_3$. The disadvantage of this is to considerably limit the control of the effect thus produced. It is thus possible to select the central value of the base voltage of the transistor $T_4$, but at that time, the amplitude of its variation cannot be selected. On the other hand, if it is desired to select the amplitude of this variation, then the central value cannot be selected and, in any case, the value of this amplitude is limited to a fraction of the switching amplitude $\Delta V$ of the ECL gate.

The circuit which will now be described enables both parameters to be selected and furthermore to be selected within a range of values as wide as desired.

The base of a transistor $T_6$ is connected to the collector of the transistor $T_3$. The collector of the transistor $T_6$ is connected to a supply voltage $V_c$, and its emitter is connected to a point C via three resistors in series, $R_{10}$, $R_{11}$, and $R_{12}$ respectively, a forward biased diode $T_{10}$ possibly being interposed between the emitter of the transistor $T_{10}$ and the resistor $R_{10}$ in order to perform a level compensation. The point A which is common to the resistors $R_{10}$ and $R_{11}$ is connected to a current source ($R_8$, $T_8$) of value $I_c$. The point B which is common to the resistors $R_{11}$ and $R_{12}$ is connected to the base of the transistor $T_4$, possibly via a resistor $R_4$. The abovementioned point C, at the other end of the resistor $R_{12}$, is connected to a reference voltage source $U_{REF}$. This reference voltage source comprises transistor $T_7$ whose collector is connected to the supply voltage source $V_c$, whose base receives a reference voltage ($V_c - V_{REF}$), and of which an emitter is connected to the point C and to a current source ($R_9$, $T_9$) of value $I_D$. This current $I_D$ ensures, in particular, that a current $I_r$ always flows through the said emitter such that the following is always true:

$$U_{REF} = V_c - V_{REF} - V_{BE}$$

$V_{BE}$ denoting the base-emitter voltage of a transistor, i.e. approximately 0.7 V.

Three principal states can be distinguished. When the input signal E is at the low level (first state), the transistor $T_3$ is cut off and the collector of the transistor $T_3$ is at the voltage $V_c$. When the signal E is at the high level (second state), the transistor $T_3$ is conducting and the collector of the transistor $T_3$ is at the voltage $V_c - \Delta V$ where:

$$\Delta V = R_3 I_1$$

This value $\Delta V$ of the switching amplitude is fixed by the standards defining the circuit (800 mV for ECL).

The third state is a state of transient equilibrium.

In the first state (E at the low level), the voltage on the emitter of the transistor $T_{10}$ (point 0) is at the high level which is higher than the voltage at the point C and the entire current $I_c$ passes through the resistor $R_{10}$. In the second state (E at the high level), the voltage at the point D is at the low level which is lower than the voltage at the point C, the voltage at the point A is lower than that at the point C and the current $I_c$ is divided between the two branches $R_{10}$ and ($R_{11}$, $R_{12}$). This is what enables an adjustment to be performed on the amplitude of the voltage variation on the base of the transistor $T_4$ and therefore the use of the input circuit for different values of $\Delta V$. In the third state, the voltages at the point A and at the point C are equal, there is no current in the branch ($R_{11}$, $R_{12}$) and the voltage at the point B therefore has the value $U_{REF}$ which must, for symmetrical operation, be equal to the value $E_0$ of the input signal E at mid-slope.

In this case the following is true:

$$E_0 = U_{REF} = V_c - V_{REF} - V_D$$

from which the value of $V_{REF}$ is derived $$V_{REF} = V_c - V_D - E_0$$

There will now be described a method of calculating the components of the circuit which will enable a symmetrical operation to be obtained.

For a symmetrical operation, the circuit is chosen to be in the third state for a switching half-amplitude, i.e.:

$$S = V_c - \Delta V/2$$

The equation of equilibrium is therefore written:

$$V_c - \Delta V/2 - V_D - V_{BE6} - R_{10}I_c = U_{REF} = V_c - V_{REF} - V_{BE7}$$

where
$V_D$ is the voltage drop in a diode
$V_{BE6}$ is the base-emitter voltage of the transistor $T_6$
$V_{BE7}$ is the base-emitter voltage of the transistor $T_7$.

As the currents passing through the transistors $T_6$ and $T_7$ are respectively $I_c$ and $I_D$, ($I_r = I_D$), the first condition is obtained:

$$R_{10}I_c = V_{REF} - \Delta V/2 - V_D + V_T \text{Log } I_D/I_c \quad (1)$$

It is advantageous to choose $I_c = I_D$, giving:

$$R_{10}I_c = V_{REF} - \Delta V/2 - V_D \quad (2)$$

giving:

$$R_{10}I_c = V_c - 2V_D - E_o - \Delta V/2 \quad (2')$$

In the first state, the following is true (writing the equation of voltage at the point A)

$$V_c - (V_{BE6} + V_D + I_{10}R_{10}) = V_c - V_{REF} - V_{BE7} + I_{11}(R_{11} + R_{12})$$

$I_{11}$ denoting the current passing through the resistors $R_{11}$ and $R_{12}$. Giving $V_{BE6} + V_D + I_{10}R_{10} + I_{11}(R_{11} + R_{12}) = V_{REF} + V_{BE7}$ and $I_{10} = I_c + I_{11}$; $I_{11} + I_R = I_D$ from which:

$$V_{BE6} + V_D + (I_c + I_D - I_R)R_{10} + (I_D - I_R)(R_{11} + R_{12}) = V_{REF} + V_{BE7}$$

As the transistors $T_6$ and $T_7$ have currents flowing through them which are respectively equal to $I_c + I_D - I_R$ and $I_R$, the second condition is obtained.

$$V_{REF} = V_T \text{Log} \frac{I_c + I_D - I_R}{I_R} + V_D + (I_c + I_D - I_R)R_{10} + (I_D - I_R)(R_{11} + R_{12})$$

The ratio n can be selected between $I_D$ and $I_R$, for example equal to 2.

The following is then true for $n = 2$ and $I_c = I_D$ $$V_T \text{Log } 3 + V_D + \left(\frac{3}{2}R_{10} + \frac{R_{11} + R_{12}}{2}\right)I_c = V_{REF} \quad (4)$$

In the second state, the current $I_{11}$ flows in the other direction and the current $I_C$ is divided between $R_{10}$ on the one hand and $R_{11}$ and $R_{12}$ on the other hand:

$$V_c - \Delta V - (V_{BE6} + V_D + I_{10}R_{10}) = V_c - V_{REF} - V_{BE7} - I_{11}(R_{11} + R_{12})$$

or:

$$\Delta V + V_{BE6} + V_D + I_{10}R_{10} = V_{REF} + V_{BE7} + I_{11}(R_{11} + R_{12})$$

$$I_{10} + I_{11} = I_c$$

$$I_R = I_D + I_{11}$$

giving:

$$V_{REF} = \Delta V + V_T \text{Log} \frac{I_c + I_D - I_R}{I} + V_D + (I_c + I_D - I_R)R_{10} + (I_R - I_D)(R_{11} + R_{12}) \quad (5)$$

where $I_R$ has a value different from that in the first state.

The relationship $I_{11} = (I_c)/2$ is chosen, giving the third condition:

$$\Delta V + V_T \text{Log} \frac{I_c}{I_c + 2I_D} + V_D + \frac{R_{10} - (R_{11} + R_{12})}{2}I_c = V_{REF} \quad (6)$$

or with $I_c = I_D$, $$\Delta V - V_T \text{Log } 3 + V_D + \frac{R_{10} - (R_{11} + R_{12})}{2}I_c = V_{REF} \quad (6')$$

The following expression is obtained on bringing together the equations (4) and (6'):

$$(R_{10} + R_{11} + R_{12})I_c = \Delta V - 2V_T \text{Log} 3 \quad (7)$$

Using equation (2'), the following is obtained:

$$(R_{11} + R_{12})I_c = 3/2 \Delta V - 2V_T \text{Log} 3 - V_c + 2V_D + E_o \quad (8)$$

The equations (2') and (8) enable the values of the components of the input circuit to be selected as a function both of the switching amplitude $\Delta V$ of the emitter coupled logic stage and of the central switching value $E_o$ on the base of the transistor $T_3$.

It is furthermore possible to select the value of the deviation $|V_B - E_O|$ in the first and second states. This deviation is the same in both these states as a symmetrical function has been chosen (see above).

The following is true in the first state:

$$|V_B - E_0| = V_B - E_0 = V_c - 2V_D - \frac{3}{2} R_{10}I_c - \frac{R_{11}I_c}{2} E_0$$

Replacing $R_{10}I_c$ by its value taken from (2'), and replacing $V_c - E_O$ by $V_{REF} + V_D$ the following is obtained:

$$|V_B - E_0| = \frac{V_D}{2} + \frac{3}{4} \Delta V - \frac{V_{REF}}{2} - \frac{R_{11}I_c}{2}$$

By selecting the value of $R_{11}I_c$, the value of $|V_B - E_O|$ is selected and therefore the amplitude of the control signal. Example:
$V_{REF} = 1.3$ V
$\Delta V = 600$ mV
$I_c = I_D = 250$ μA
$V_D = 0.75$ V
$R_{10} = 1$ kohm
$R_{11} = R_{12} = 500$ ohms
$|V_B - E_O| = 112.5$ mV

I claim:

1. Switching input circuit comprising: a stage of the emitter coupled logic (ECL) type having first and second transistors, the first transistor receiving at its base an input signal and the second transistor receiving at its base a control signal which is generated by a control circuit responsive to a signal from a collector of the first transistor, in order to obtain at a collector of the second transistor an output signal switching faster than the input signal, wherein the control circuit comprises a third transistor whose collector is connected to a voltage supply source and whose base is connected to the collector of the first transistor, a first resistor, a second resistor and a third resistor connected in series between an emitter of the third transistor and a reference point to which is connected a reference voltage source and a first reference current source, means connecting a point common to the first resistor and the second resistor to a second reference current source, and a point common to the second resistor and the third resistor supplying said control signal and being connected to the base of the second transistor.

2. A circuit according to claim 1, wherein the reference voltage source comprises a fourth transistor whose collector is connected to the voltage supply source and whose base is connected to a reference voltage.

3. A circuit according to claim 2, which comprises at least one forward biased diode connected between the emitter of the third transistor ($R_{10}$) and the first resistor ($R_{10}$).

4. A circuit according to claim 1, which comprises at least one forward biased diode connected between the emitter of the third transistor and the first resistor.

* * * * *

UNITED STATES PATENT AND TRADEMARK OFFICE
CERTIFICATE OF CORRECTION

PATENT NO. : 4,972,103

DATED : November 20, 1990

INVENTOR(S) : STEPHANE BARBU

It is certified that error appears in the above-identified patent and that said Letters Patent is hereby corrected as shown below:

```
Column 1, line  5, change "The" to --This--;
          line 10, change "from" to --at--;
          line 16, change ", the" to --.  The--;
          line 17, change "signal consisting" to --circuit
                   consists--;
          line 21, delete "the putting into conduction of";
                   after "transistor" insert --is made to conduct
                   and--;
          line 23, after "which" insert --thus--;
          line 53, change "the" (first occurrence) to --a--;
Column 2, line  2, delete "first";
          line 10, change "performed" to --obtained--;
          line 35, delete "R_4";
Column 3, line  1, change "D" to --O--; after "level" insert
                   --,-- (comma);
          line  2, change ", the" to --.  The--;
          line 35, after "diode" insert --,-- (comma);
          line 36, after "T_6" insert --,-- (comma);
Column 4, line 67, after "both" insert --of--.

Claim 1, line  1, change "Switching" to --A switching--;
                  change "a stage of the" to --an--;
          line  2, change "type" to --stage--.
```

UNITED STATES PATENT AND TRADEMARK OFFICE
CERTIFICATE OF CORRECTION

PATENT NO. : 4,972,103

DATED : November 20, 1990

INVENTOR(S) : STEPHANE BARBU

It is certified that error appears in the above-identified patent and that said Letters Patent is hereby corrected as shown below:

Claim 3, lines 3 & 4, delete "$(R_{10})$".

Signed and Sealed this

Seventeenth Day of March, 1992

*Attest:*

HARRY F. MANBECK, JR.

*Attesting Officer*  *Commissioner of Patents and Trademarks*